United States Patent
Brandow

(10) Patent No.: US 10,290,524 B2
(45) Date of Patent: May 14, 2019

(54) MULTI-WAFER SUBSTRATE HOLDER WITH ADJUSTABLE INFRARED RADIATION ABSORBING ZONES

(71) Applicant: III-V Components, Goleta, CA (US)

(72) Inventor: Dennis James Brandow, Sammamish, WA (US)

(73) Assignee: III-V Components, Goleta, CA (US)

( * ) Notice: Subject to any disclaimer, the term of this patent is extended or adjusted under 35 U.S.C. 154(b) by 366 days.

(21) Appl. No.: 15/407,869

(22) Filed: Jan. 17, 2017

(65) Prior Publication Data

US 2017/0207111 A1     Jul. 20, 2017

Related U.S. Application Data

(60) Provisional application No. 62/395,774, filed on Sep. 16, 2016, provisional application No. 62/279,266, filed on Jan. 15, 2016.

(51) Int. Cl.
*H01L 21/67*     (2006.01)

(52) U.S. Cl.
CPC .. *H01L 21/67248* (2013.01); *H01L 21/67115* (2013.01)

(58) Field of Classification Search
CPC ......... H01L 21/67248; H01L 21/67115; H01L 21/67242; H01L 21/67265; H01L 21/673; H01L 21/67306; H01L 21/67309; H01L 21/67313; H01L 21/67316; H01L 21/6732; H01L 21/67323; H01L 21/67326; H01L 21/6733; H01L 21/6735; H01L 21/67353; H01L 21/67383; H01L 21/67098; H01L 21/67103; H01L 21/67276; H01L 21/67282; H01L 21/67303; H01L 21/68; H01L 21/683; H01L 21/6833; H01L 21/68714; H01L 21/68735; H01L 21/68778; H01L 21/68771; H01L 21/68757; H01L 21/67069; H01L 21/67126; H01L 21/67748; H01L 21/67757; H01J 37/32715; H01J 37/32724; H01J 37/32366; H01J 37/32431; C30B 23/02; C30B 23/063; C23C 14/505; H05B 3/0047

See application file for complete search history.

(56) References Cited

U.S. PATENT DOCUMENTS

| | | |
|---|---|---|
| 5,951,774 A | 9/1999 | Shishiguchi et al. |
| 9,273,413 B2 | 3/2016 | Krishnan et al. |
| 2003/0049372 A1 | 3/2003 | Cook |

OTHER PUBLICATIONS

Veeco UNI-Block: Excellent Performance and Convenience with a Non-Bonded Substrate Holder, Compound Semiconductor MBE Operations, Aug. 1996, Note No. 3/93.
Vecco Product Guide GEN930 MBE System, MBE Operations, 2003 Veeco Instruments Inc.

*Primary Examiner* — Shawntina T Fuqua
(74) *Attorney, Agent, or Firm* — Burris Law, PLLC

(57) ABSTRACT

An infrared radiation absorbing assembly for use in semiconductor processing is provided that includes a holder defining a plurality of zones and at least one infrared radiation absorbing member disposed within at least one zone of the holder. The at least one infrared radiation absorbing member is configured to control an amount of infrared radiation that reaches a sample and thus the temperature of the sample disposed proximate the holder.

20 Claims, 10 Drawing Sheets

MULTI-WAFER SUBSTRATE HOLDER WITH ADJUSTABLE INFRARED RADIATION ABSORBING ZONES

CROSS-REFERENCE TO RELATED APPLICATIONS

This application claims the benefit of U.S. provisional application Ser. No. 62/279,266 filed on Jan. 15, 2016 and U.S. provisional application Ser. No. 62/395,774 filed on Sep. 16, 2016. The disclosures of the above applications are incorporated herein by reference in their entirety.

FIELD

The present disclosure relates to semiconductor processing and more specifically to devices that are used to hold substrates for processing during test and evaluation.

BACKGROUND

The statements in this section merely provide background information related to the present disclosure and may not constitute prior art.

A variety of devices have been employed to hold multiple semiconductor substrates in a semiconductor deposition reactor for faster processing. These devices are commonly configured to maintain multiple wafers (substrates/samples) at the same controlled temperature during material growth.

SUMMARY

Researchers using molecular beam epitaxy (MBE) have typically only grown one sample inside a reactor because there has not previously been an economically feasible way to individually vary the temperature (the main substrate variable during growths) of multiple substrates being manipulated inside a deposition reactor. The present disclosure provides a solution to this problem.

The present disclosure provides a substrate holder used in semiconductor materials processing defining a plurality of apertures used to hold multiple substrates or samples, where an infrared radiation absorbing pack (comprising, in one form, various types of infrared absorbing material) is held between each substrate (sample) and a substrate heater adjacent to the sample during material growths, to reduce the temperature of the substrate in each zone by altering infrared radiation absorbing characteristics.

The present disclosure provides a substrate holder assembly for use in semiconductor processing comprising a sample holder configured to be disposed within a substrate holder, the sample holder defining a plurality of apertures arranged in zones and configured to hold a plurality of samples. A backing plate is disposed proximate the sample holder and has a plurality of recesses arranged in zones to match the zones of the sample holders. A plurality of infrared radiation absorbing packs are disposed within the recesses of the backing plate, and a temperature of the samples being processed can be individually controlled by tailoring characteristics of the infrared radiation absorbing packs. In one form, the sample holder and the substrate holder are a single integrated member/part.

In variations of the substrate holder assembly, the infrared radiation absorbing packs comprise at least one layer of infrared radiation absorbing material, which may be a tantalum foil. In another form, the zones define four quadrants. The sample holder may define a plurality of individual sample holders, and the sample holder in one form defines a plurality of peripheral tabs configured to engage the outer periphery of the substrate holder. The sample holder may further comprise a plurality of internal spring arms configured to hold the samples. The backing plate in one form is a pyrolytic boron nitride (PBN) material.

The substrate holder assembly alternately comprises a lid disposed over the backing plate and infrared radiation absorbing packs, which may be a tantalum material. In another form, the substrate holder assembly further comprises a substrate holder and a retaining member disposed over the lid and being secured to the outer periphery of the substrate holder.

In another form of the present disclosure, an infrared radiation absorbing assembly for use in semiconductor processing is provided that comprises a holder defining a plurality of zones and at least one infrared radiation absorbing member disposed within at least one zone of the holder, wherein the at least one infrared radiation absorbing member is configured to control a temperature of an adjacent sample disposed proximate the holder. In variations of the infrared radiation absorbing assembly, the infrared radiation absorbing member comprises polarizing plates that are configured to rotate to alter an amount of infrared radiation. The infrared radiation absorbing member may alternately include a pattern of openings. There may also be a plurality of infrared radiation absorbing members, and each infrared radiation absorbing member may define a plurality of layers of infrared radiation absorbing material, which may be a tantalum foil. In one form, the holder defines a plurality of apertures arranged in zones and configured to hold a plurality of samples. The apertures may define a geometry selected from the group consisting of square, round, oval, rectangular, and polygonal. Further, the holder defines a molybdenum material in one form of the present disclosure.

It should be understood that the variety of features and materials disclosed herein may be used individually or in any combination while remaining within the scope of the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
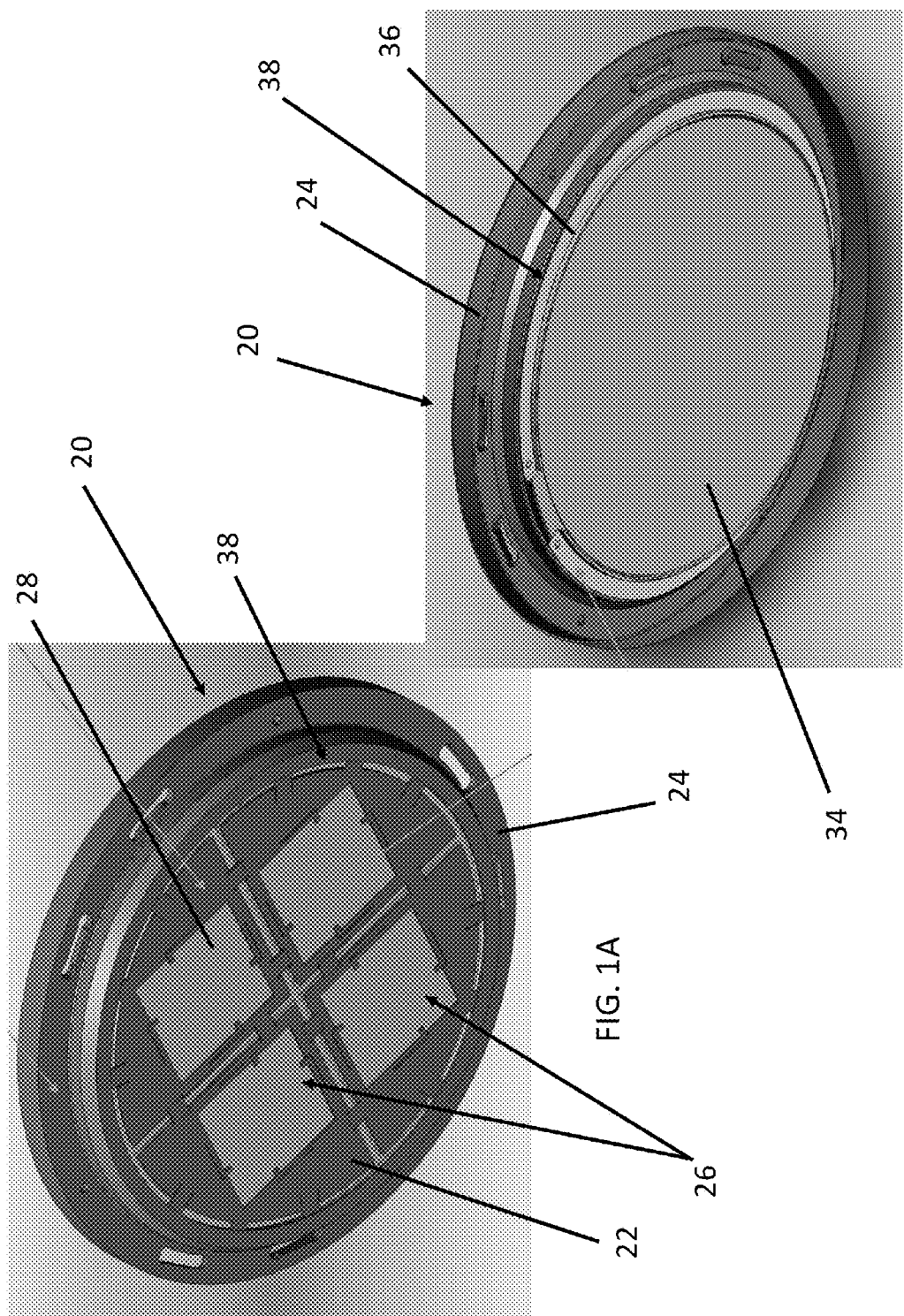
FIG. 1A is a bottom perspective view of a substrate holder assembly constructed in accordance with the principles of the present disclosure.
FIG. 1B is top perspective view of the substrate holder assembly of FIG. 1A.
Figure 2:
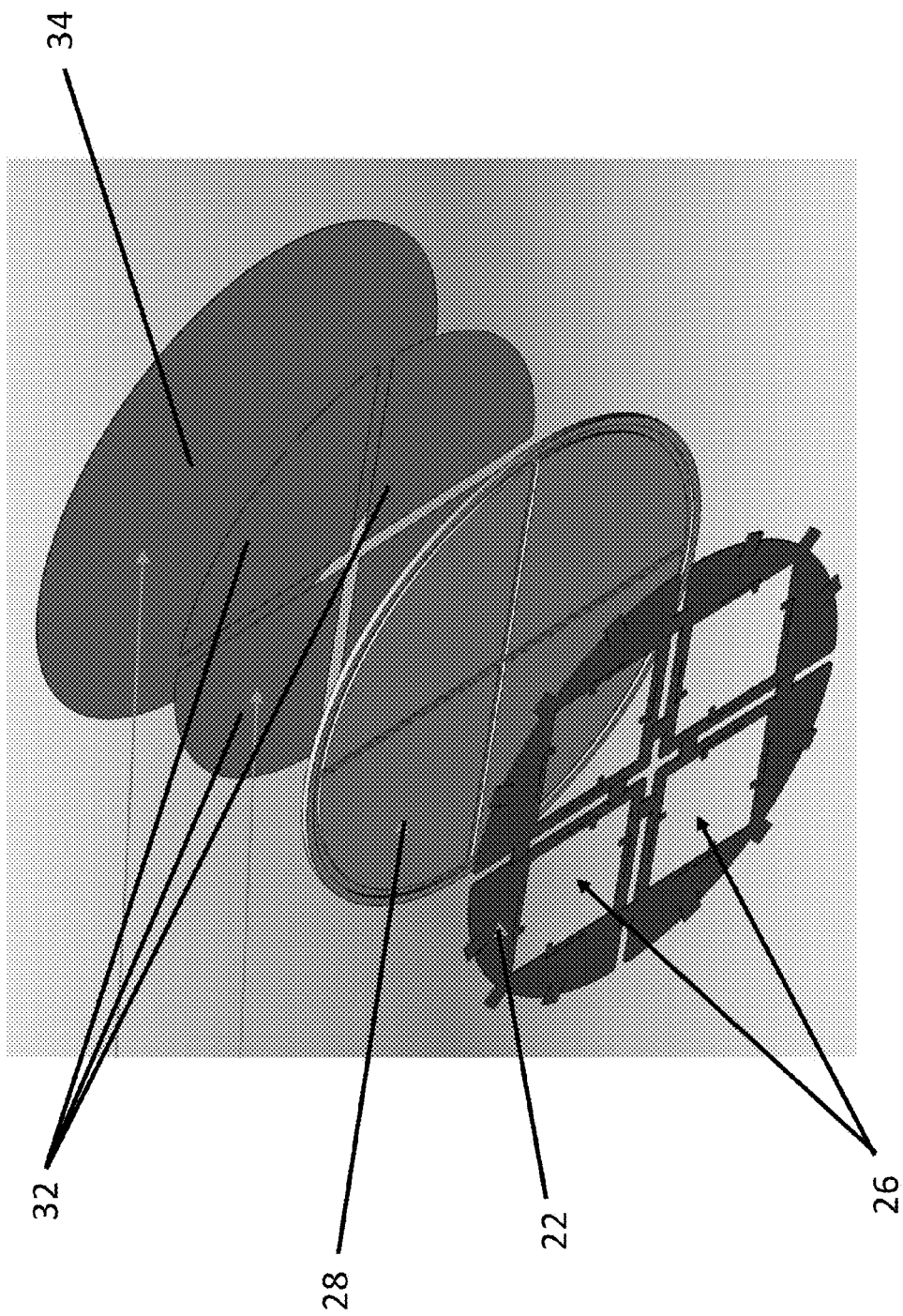
FIG. 2 is an exploded perspective view of the substrate holder assembly of FIGS. 1A and 1B.
Figure 3:
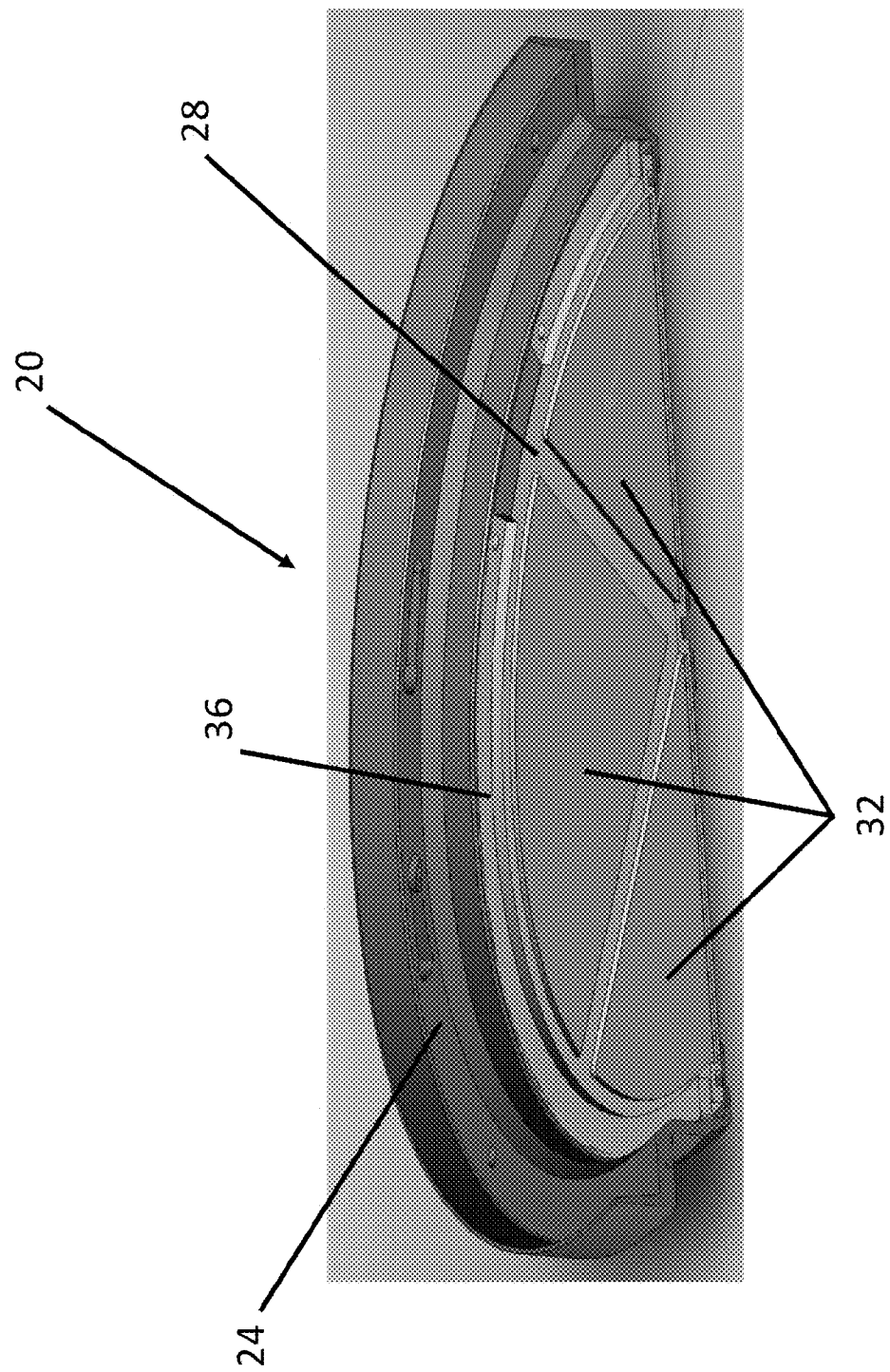
FIG. 3 is a partial cutaway perspective view illustrating infrared radiation absorbing packs constructed in accordance with one form of the present disclosure.
Figure 4:
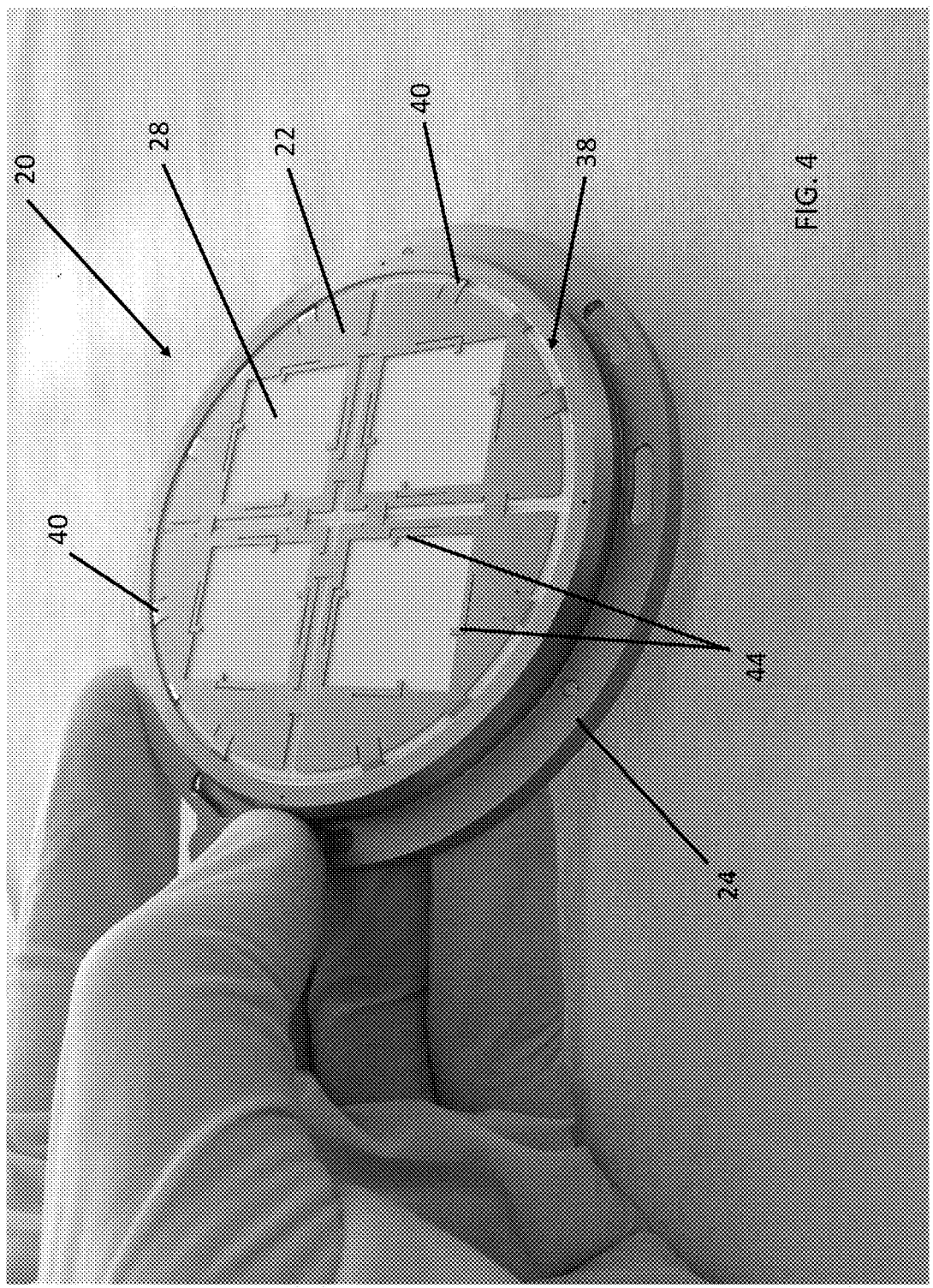
FIG. 4 is a photograph of a prototype substrate holder assembly constructed in accordance with the principles of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIGS. 1A through 3, a substrate holder assembly is illustrated and generally indicated by reference numeral 20. The substrate holder assembly 20 generally includes a sample holder 22 configured to be disposed within a substrate holder 24, wherein the sample holder 22 defines a plurality of apertures 26 arranged in zones and configured to hold a plurality of samples (not shown). A backing plate 28 is disposed proximate the sample holder 22, (shown through apertures 26 of sample holder 22), and the backing plate 28 has a plurality of recesses 30 (best shown in FIG. 6) arranged in zones to match the zones of the sample holder 22. A plurality of infrared radiation absorbing packs 32 are disposed within the recesses 30 of the backing plate 28 such that a temperature of the samples being processed can be individually controlled by tailoring characteristics of the infrared radiation absorbing packs 32. The infrared radiation absorbing packs 32 in one form are layers of infrared radiation absorbing material such as a tantalum foil, and the number of layers of infrared radiation absorbing material can be varied in order to control the temperature of each individual sample during processing. Variations of the infrared radiation absorbing packs are contemplated by the present disclosure and are described in greater detail below as "infrared radiation absorbing members."

Generally, the substrate holder assembly 20 is adapted for use in molecular beam epitaxy (MBE) equipment, which is not illustrated in detail herein for purposes of clarity. Reference is made to U.S. Pat. Nos. 4,944,246 and 6,053,981 for further background information, which are incorporated herein by reference in their entirety.

The substrate holder assembly 20 also includes a lid 34 disposed over the backing plate 28 and the infrared radiation absorbing packs 32, which in one form is a tantalum material. Finally, a retaining member 36 is disposed over the lid 34 and is secured to the outer periphery 38 of the substrate holder 24 to secure each of the components within the assembly. The retaining member 36 in this form is a locking ring, however, other retaining devices may be employed while remaining within the scope of the present disclosure.

As shown, the zones in the backing plate 28 define four (4) quadrants, however, it should be understood that any number and size/geometry of zones may be employed while remaining within the scope of the present disclosure. In one form, the backing plate 28 is a pyrolytic boron nitride (PBN) material. It should be understood that other high-temperature materials may also be used while remaining within the scope of the present disclosure.

The sample holder 22 in this form is a single-piece member, however, a sample holder comprised of a plurality of individual sample holders are also to be considered within the scope of the present disclosure. The sample holder 22 defines a plurality of peripheral tabs 40 configured to engage the outer periphery 38 of the substrate holder 24. The apertures 26 of the sample holder 22 in this form are square, but it should be understood that other shapes such as round, oval, rectangular, and polygonal may be employed while remaining within the scope of the present disclosure. In one form, the sample holder 22 is a molybdenum material.

Figure 5:
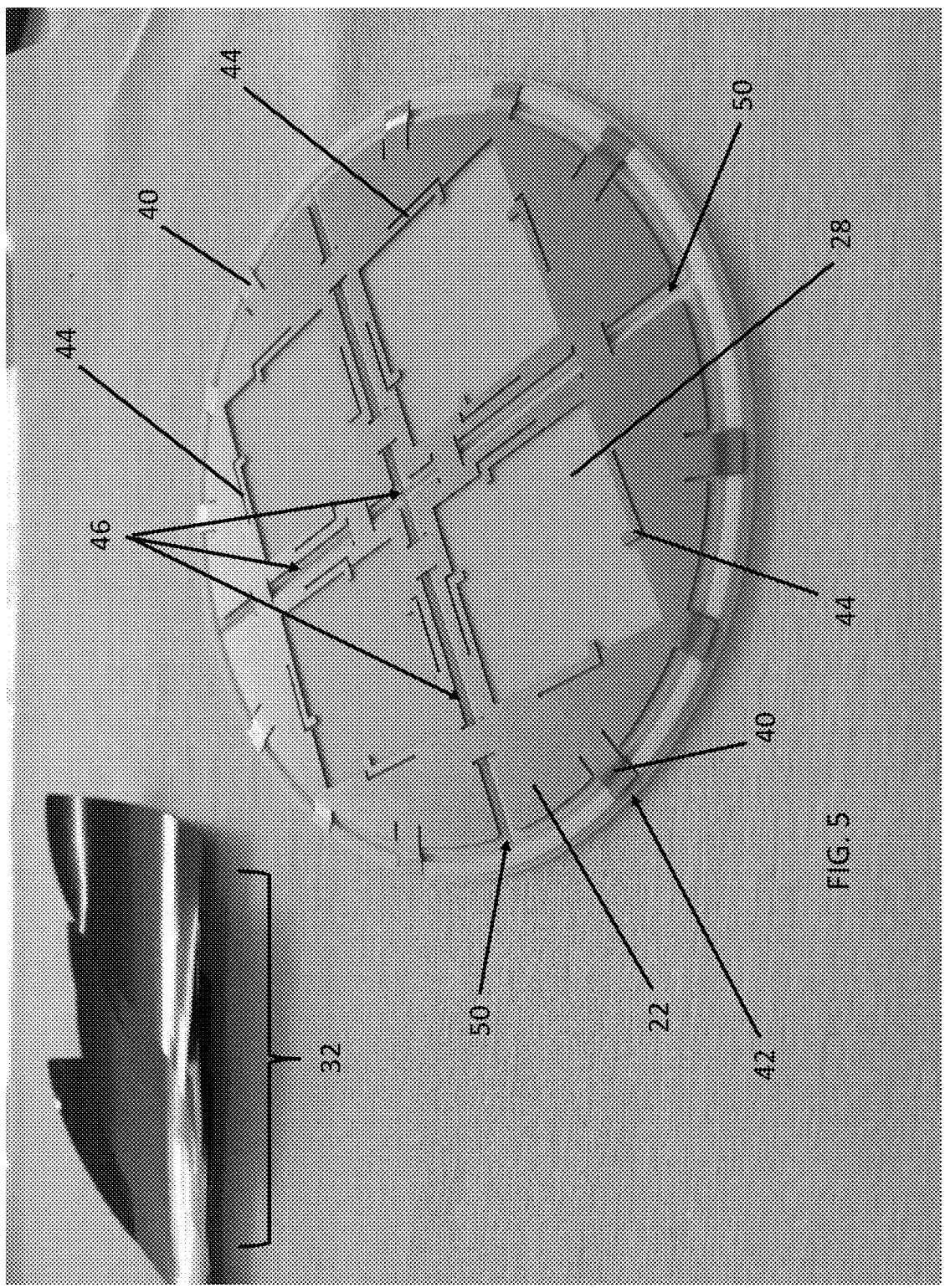
FIG. 5 is another photograph of an infrared radiation absorbing assembly from the substrate holder assembly of FIG. 4.
Figure 6:
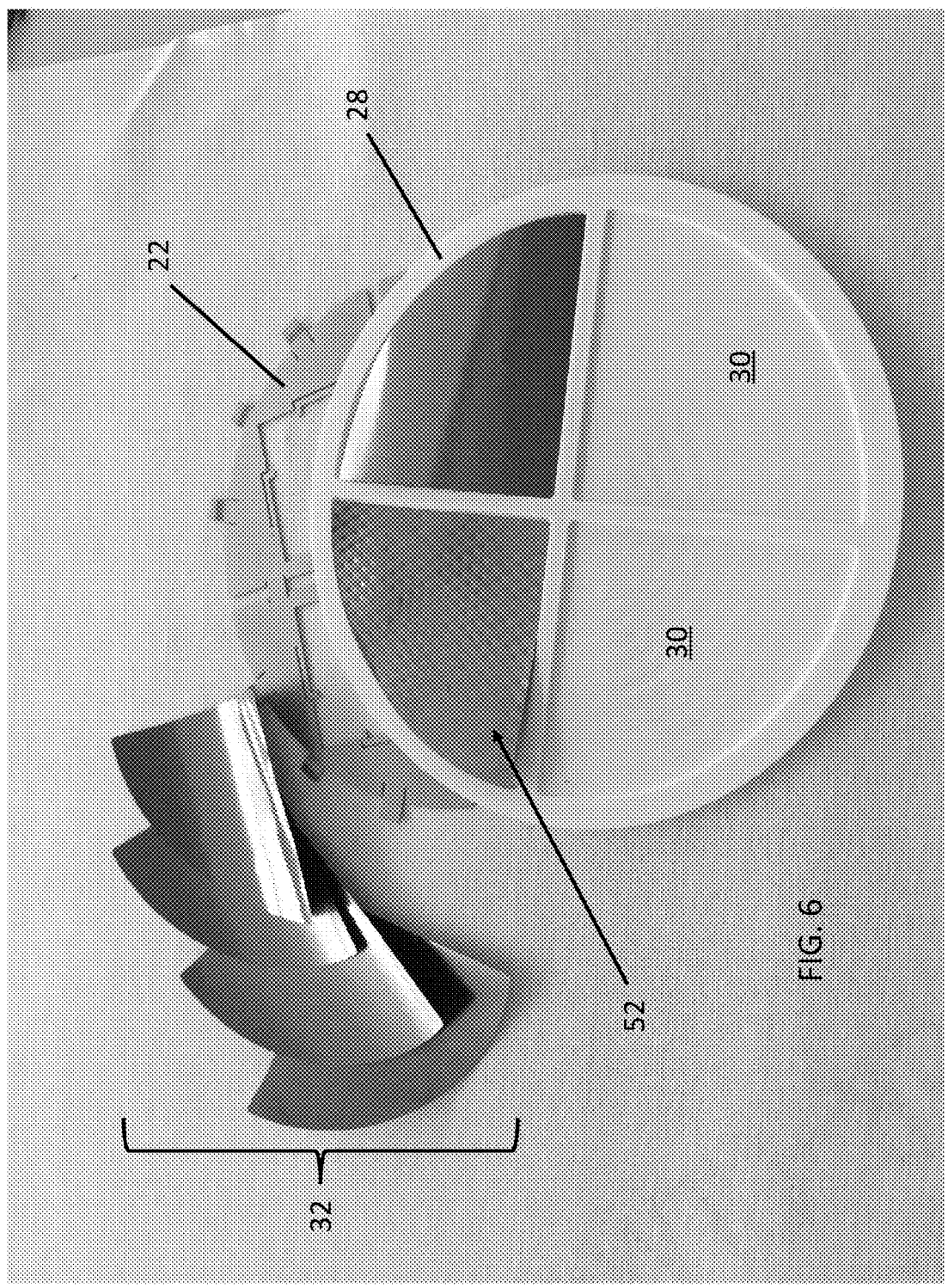
FIG. 6 is a photograph illustrating a holder, or a backing plate, having a plurality of zones and different forms of infrared radiation absorbing members configured to be disposed within the zones in accordance with the teachings of the present disclosure.

Referring to FIGS. 5 and 6, in one form, the peripheral tabs 40 also engage recesses 42 formed into the backing plate 28. The sample holder 22 further comprises a plurality of internal spring arms 44 configured to hold the samples. The sample holder 22 also includes a plurality of cuts 46 that separate each of the zones for thermal isolation, and the backing plate 28 also includes a corresponding set of trenches 50 to assist with thermal isolation between each of the zones.

Figure 7:
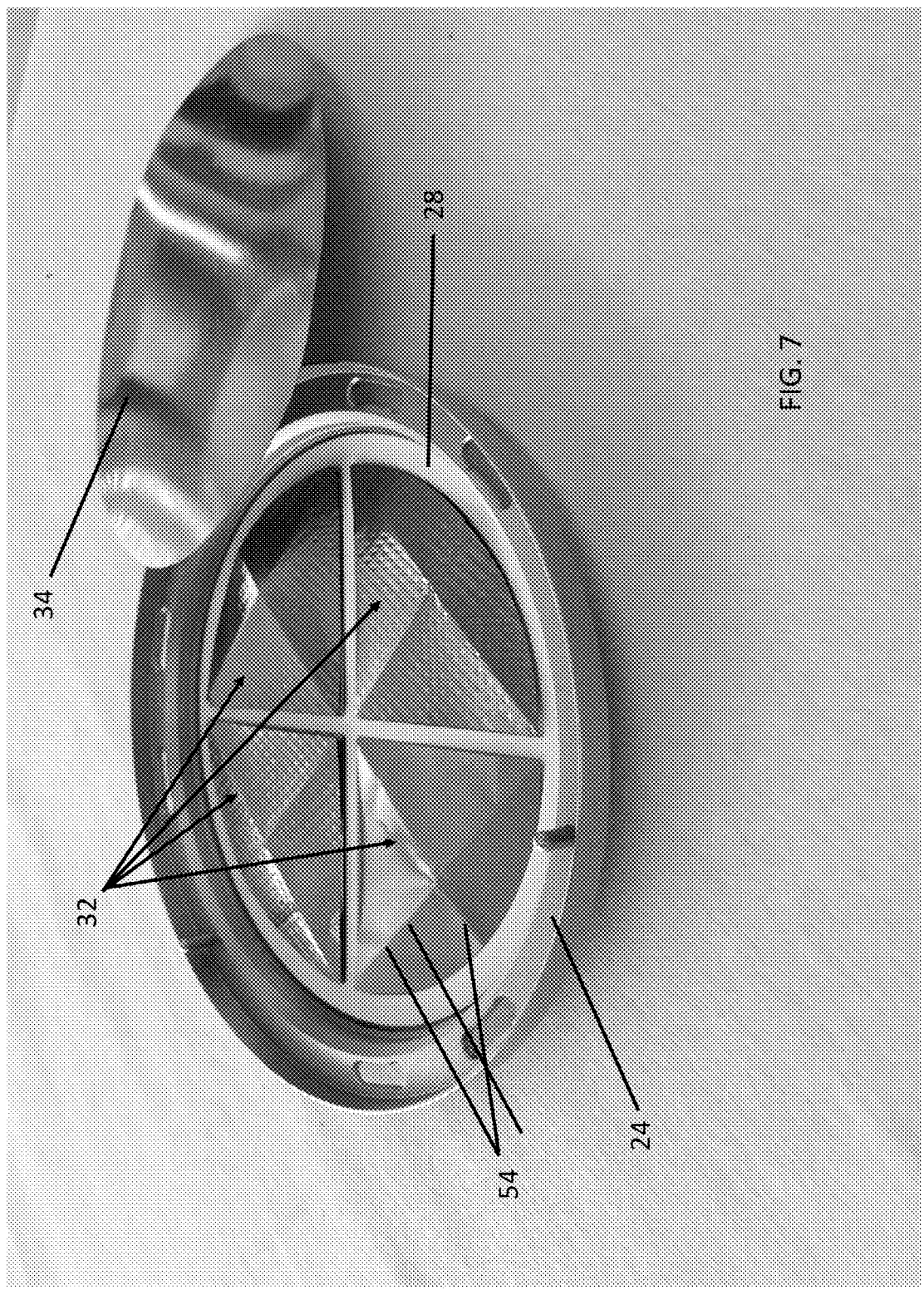
FIG. 7 is a photograph illustrating the inside of a substrate holder having the holder/backing plate and a variety of infrared radiation absorbing members constructed in accordance with the principles of the present disclosure.

As shown in FIGS. 6 and 7, the infrared radiation absorbing members in the form of infrared radiation absorbing packs 32 are illustrated in greater detail. As shown, the infrared radiation absorbing packs 32 include layers, wherein at least one layer is disposed within each recess 30 to adjust the infrared radiation that reaches a corresponding sample and thus the temperature of the sample. It should also be understood that certain recesses may have no infrared radiation absorbing packs 32 while remaining within the scope of the present disclosure. Accordingly, one or more layers of infrared radiation absorbing material, thereby defining an infrared radiation absorbing pack 32, may be used in each zone to adjust the temperature/heat flow to each sample. For example, 1-5 layers of 0.001 tantalum foil. In one alternate form, every other layer of the infrared radiation absorbing packs 32 includes dimples 52 to reduce contact between adjacent layers and thus reduce conductive heat transfer between each layer. In another form, each layer may include creases 54 in order to control deformation of each layer as the infrared radiation absorbing packs 32 are assembled.

Figure 8:
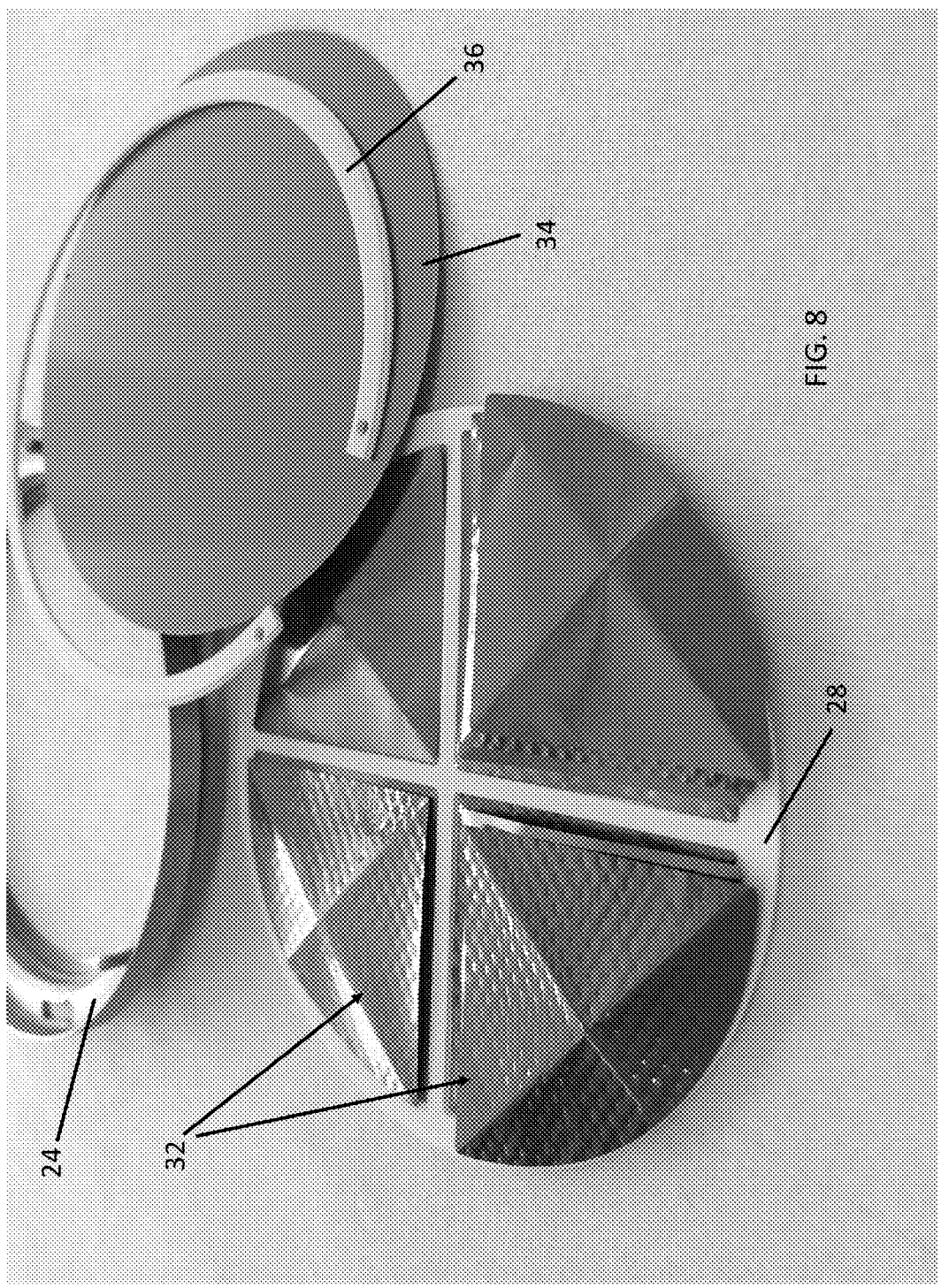
FIG. 8 is a photograph illustrating various components of the substrate holder assembly constructed in accordance with the principles of the present disclosure.
Figure 9:
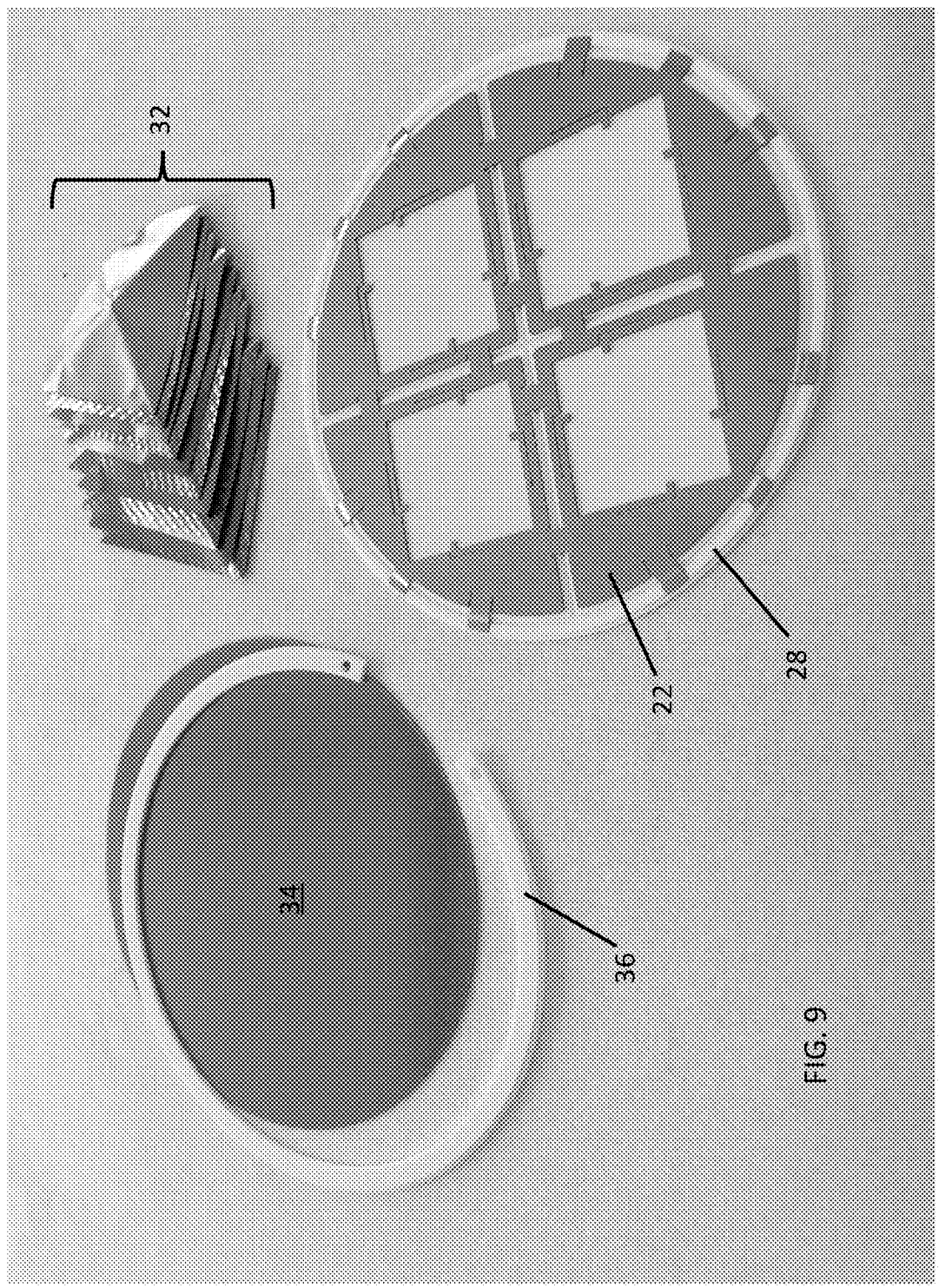
FIG. 9 is another photograph illustrating various components of the substrate holder assembly constructed in accordance with the principles of the present disclosure.
Figure 10:
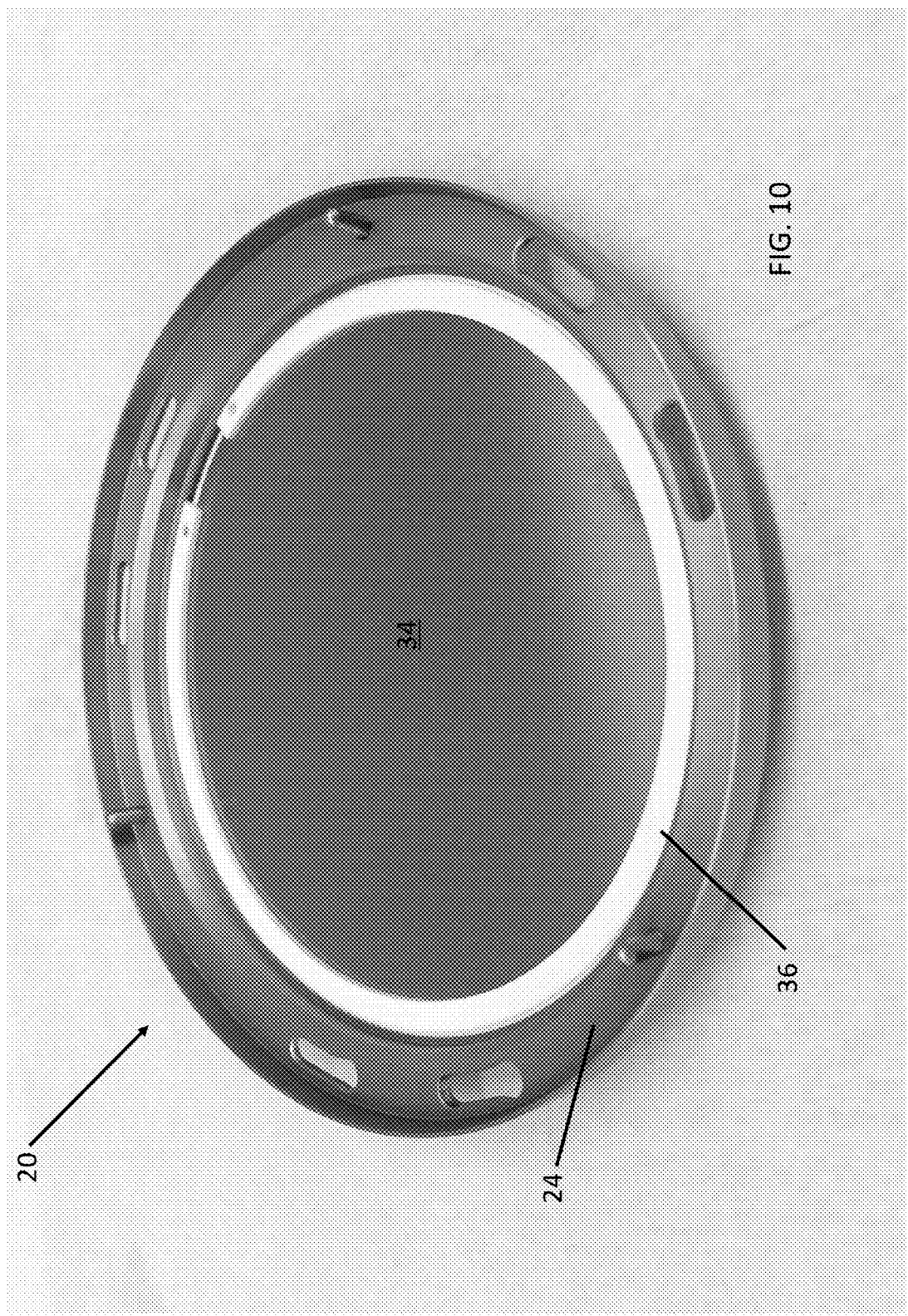
FIG. 10 is a photograph illustrating a fully assembled substrate holder assembly constructed in accordance with the principles of the present disclosure.

FIGS. 8-10 are also provided to further illustrate the various components of one form of a substrate holder assembly 20 constructed in accordance with one form of the present disclosure. These photographs show the In still another form, not shown, the infrared radiation absorbing members could be infrared polarizing plates that are configured to rotate to alter an amount of infrared radiation reaching the samples. It should be understood that these variations of infrared radiation absorbing members to control temperature of the samples being processed are to be construed as being within the scope of the present disclosure.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A substrate holder assembly for use in semiconductor processing comprising:
   a sample holder configured to be disposed within a substrate holder, the sample holder defining a plurality of apertures arranged in zones and configured to hold a plurality of samples;
   a backing plate disposed proximate the sample holder, the backing plate having a plurality of recesses arranged in zones to match the zones of the sample holders;
   a plurality of infrared radiation absorbing packs disposed within the recesses of the backing plate;
   wherein a temperature of the samples being processed can be individually controlled by tailoring characteristics of the infrared radiation absorbing packs.

2. The substrate holder assembly according to claim 1, wherein the infrared radiation absorbing packs comprise at least one layer of infrared radiation absorbing material.

3. The substrate holder assembly according to claim 2, wherein the at least one layer of infrared radiation absorbing material is a tantalum foil.

4. The substrate holder assembly according to claim 1, wherein the zones define four quadrants.

5. The substrate holder assembly according to claim 1, wherein the sample holder defines a plurality of individual sample holders.

6. The substrate holder assembly according to claim 1, wherein the sample holder defines a plurality of peripheral tabs configured to engage the outer periphery of the substrate holder.

7. The substrate holder assembly according to claim 1, wherein the sample holder further comprises a plurality of internal spring arms configured to hold the samples.

8. The substrate holder assembly according to claim 1, wherein the backing plate is a pyrolytic boron nitride (PBN) material.

9. The substrate holder assembly according to claim 1 further comprising a lid disposed over the backing plate and infrared radiation absorbing packs.

10. The substrate holder assembly according to claim 9, wherein the lid is a tantalum material.

11. The substrate holder assembly according to claim 1 further comprising:
    a substrate holder; and
    a retaining member disposed over the lid and being secured to the outer periphery of the substrate holder.

12. The substrate holder assembly according to claim 1, wherein at least one infrared radiation absorbing pack comprises a plurality of layers, and every other layer comprises dimples.

13. An infrared radiation absorbing assembly for use in semiconductor processing comprising:
    a holder defining a plurality of zones; and
    at least one infrared radiation absorbing member disposed within at least one zone of the holder,
    wherein the at least one infrared radiation absorbing member is configured to control a temperature of an adjacent sample disposed proximate the holder.

14. The infrared radiation absorbing assembly according to claim 13, wherein the infrared radiation absorbing member comprises polarizing plates that are configured to rotate to alter an amount of infrared radiation.

15. The infrared radiation absorbing assembly according to claim 13, wherein the infrared radiation absorbing member comprises a pattern of openings.

16. The infrared radiation absorbing assembly according to claim 13, wherein the at least one infrared radiation absorbing member defines a plurality of layers of infrared radiation absorbing material.

17. The infrared radiation absorbing assembly according to claim 16, wherein the plurality of layers of infrared radiation absorbing material comprises layers of tantalum foil.

18. The infrared radiation absorbing assembly according to claim 13, wherein the holder defines a plurality of apertures arranged in zones and configured to hold a plurality of samples.

19. The infrared radiation absorbing assembly according to claim 18, wherein the holder defines a plurality of individual sample holders.

20. The infrared radiation absorbing assembly according to claim 18, wherein the holder further comprises a plurality of internal spring arms configured to hold the samples.

* * * * *